United States Patent Office 3,706,645
Patented Dec. 19, 1972

3,706,645

PROCESS INCLUDING PHOTOLYTIC ENHANCEMENT FOR ANODIC DISSOLUTION OF A GALLIUM ARSENIDE WAFER

Howard G. Lasser, Springfield, Va., assignor to the United States of America as represented by the Secretary of the Army No Drawing. Filed Sept. 30, 1971, Ser. No. 185,358
Int. Cl. H01k 7/52
U.S. Cl. 204—143 GE 8 Claims

ABSTRACT OF THE DISCLOSURE

A photolytic process is used to enhance chemical or electrochemical anodic dissolution of one side of a p-type gallium arsenide wafer. Photons from a laser source are focused over 50% of the one side of the gallium arsenide wafer by means of fiber optics. The photons pass through a transparent container filled with a liquid electrolyte in which the wafer is totally immersed during the process. An incandescent light source completely floods the other side of the wafer that is opposite the one side. The other side of the wafer is made passive to the electrolyte by applying film, such as silicon dioxide thereto.

The invention described herein may be manufactured and used by or for the Government of the United States of America for governmental purposes without the payment to me of any royalties thereon.

BACKGROUND AND SUMMARY OF THE INVENTION

A problem that has existed in thin wafers of gallium arsenide of from 1 to 5 microns thick and having large widths, of ½–3 inches and larger, is that the wafers are not self-supporting, i.e., tend to break up easily. A chemical anodic dissolution process enhanced by a photolytic method as shown and described in the present invention is used to produce a honeycomb structure for making the large dimensioned thin wafer of gallium arsenide self-supporting.

The present invention is a process of anodic dissolution of one side of a thin gallium arsenide wafer by focusing a laser beam on that side by use of fiber optics while the gallium arsenide wafer is immersed in a liquid electrolyte. The other side of the wafer is coated with a chemically inert film, such as silicon dioxide, so that the other side is passive to the electrolyte. An incandescent light source is positioned to flood the other side with light. The focused laser light covers about 50% of the one side of the wafer and greatly enhances the anodic dissolution of electrons out of the gallium arsenide wafer into the electrolyte at the light spots caused by the laser light.

DESCRIPTION OF THE PREFERRED EMBODIMENT

The semiporous wafer of gallium arsenide produced by the present process is useful in two important ways. One is that of mechanical support for the thin wafer when the wafer has large lateral dimensions. The other is that of perpendicular porous surfaces on one side of the wafer that acts as a secondary emitter of electrons when used as a microchannel plate.

In the present process, the other side of a gallium arsenide wafer is made passive to a liquid electrolyte, such as a sulfuric acid electrolyte that is used in the preferred process, by application of a thin chemically inert film such as silicon dioxide thereon. The wafer is totally immersed in the sulfuric acid electrolyte within a light transparent container. The sulfuric acid electrolyte constitutes sulfuric acid in 5 parts by volume, hydrogen peroxide in 1 part by volume, and deionized water in 1 part by volume. The gallium arsenide wafer is held in the electrolyte by some inert material such as plastic or polyethylene. A power supply is connected with its positive terminal in electrical contact with the wafer and a negative terminal in contact with an auxiliary electrode. A gallium arsenide phosphide junction laser having the same wavelength that gallium arsenide absorbs well is focused on the one side of the wafer, i.e., the side of the wafer that does not have the chemically inert film thereon. This wavelength is between .66 and .9 microns. The laser light is focused into many small areas of about 12 microns diameter by fiber optics. Photons impinging over these small 12 micron diameter areas enhance anodic dissolution of those areas, i.e., enhances electron production from the p-type gallium arsenide wafer. An alternate method of focusing the laser light in small areas is by placing a porous aluminum oxide layer over the output end of the laser gun. These areas are also about 12 microns in diameter. These small areas cover about 50% of the total area on the one side of the wafer. The porous aluminum oxide layer used for this purpose may be produced by the method as taught by the present inventor in his copending application Ser. No. 210,909, filed Dec. 22, 1971, and entitled, Method of Preparing a Semiporous Film of Aluminum Oxide by High Voltage Anodization. The semiporous film produced by the method disclosed in the above noted copending application is made porous by removing the barrier layer, or solid side of the film. The gallium arsenide wafer of the present invention is also illuminated from the other side by flooding with an incandescent light source. It should be noted that the gallium arsenide wafer itself is photolytically activated by the photons from both the laser light and the incandescent light, and the electrolyte is not photolytically activated.

The speed of anodic dissolution is proportional to the OH concentration in the electrolyte. The OH comes from the sulfuric acid. Tieing up the sulfuric acid by the electron transport process leaves more OH available for anodic dissolution of the gallium arsenide. The other side of the wafer is passive to anodic dissolution because of the chemically inert silicon dioxide film. Anodic dissolution is discontinued just prior to dissolving completely through the wafer. The process is terminated when a sudden change in amperage through the electrolyte is indicated on an ammeter that is used in monitoring the current in the electrolyte during the process. The sudden change of amperage is produced when the dissolution of pores in the front side of the wafer are within about 1.5 microns of the other side, allowing the illumination from that side to pass through the very thin 1.5 micron layer to suddenly further enhance the dissolution of the one side. Polarity of the voltages between the wafer and an auxiliary electrode are reversed at this point to make the wafer cathodic to the now inert auxiliary electrode and halt the anodic dissolution. The wafer is then removed from the electrolyte and washed in warm distilled water.

In summary, photons from the laser act as a catalyst to the action of the electrolyte on anodic dissolution of the wafer. Anodic dissolution is accelerated by as much as 20 to 1 by the catalytic action of the photons in the lighter areas on the one side of the wafer. Pores are, therefore, burned in the one side of the wafer by the accelerated anodic dissolution in the light areas. By the laser light being at the wavelength as that readily absorbed by the gallium arsenide, pore production is enhanced where the photons strike the wafer.

Another example of a possible electrolyte for use in the above process is that of bromine and methanol in a saturated solution of methanol. Both processes are performed at room temperature. The laser exposure time using either electrolyte is found to be about 10 minutes for anodic dissolution of a 5 micron thick gallium arsenide wafer producing pores of 3.5 microns depth with the processes run at room temperature.

I claim:

1. The process of anodic dissolution of one side of a gallium arsenide wafer, comprising the steps of:

providing a gallium arsenide wafer of a desired thickness and width:

coating an other side opposite said one side with a chemically inert film;

connecting a power supply between said wafer and an auxiliary electrode;

immersing said gallium arsenide wafer and said auxiliary electrode in a liquid electrolyte solution for causing both the gallium and the arsenide from said wafer to go into the solution simultaneously;

applying a laser light source of the same wavelength that gallium arsenide readily absorbs to said one side of the wafer such that the wafer readily absorbs the light source waves therein;

flooding said other side with light from an incandescent lamp;

controlling the pattern and exposure time of light from said laser light source impinging upon said one side of the wafer such that pores of the desired pattern are burned to a desired depth in the wafer;

exposing the wafer to said light source and liquid simultaneously for a period of time at room temperature; and cleaning the liquid electrolyte from the anodized wafer by rinsing with ionized water.

2. The process of anodic dissolution of a gallium arsenide wafer as set forth in claim 1 wherein said power supply is connected with the positive terminal to said wafer and the negative terminal to said auxiliary electrode.

3. The process of anodic dissolution of a gallium arsenide wafer as set forth in claim 2 wherein said liquid electrolyte solution is 5 parts by volume of sulfuric acid, 1 part by volume hydrogen peroxide, and 1 part by volume of deionized water.

4. The process of anodic dissolution of a gallium arsenide wafer as set forth in claim 2 wherein said liquid electrolyte solution is bromine and methanol in a methanol saturation solution.

5. The process of anodic dissolution of a gallium arsenide wafer as set forth in claim 4 wherein said chemically inert film is a film of silicon dioxide.

6. The process of anodic dissolution of a gallium arsenide wafer as set forth in claim 4 wherein controlling of the pattern of light is by fiber optic focusing of the laser output light.

7. The process of anodic dissolution of a gallium arsenide wafer as set forth in claim 1 wherein said laser light source is a gallium arsenide phosphide laser with an output of less than one joule of energy.

8. The process of anodic dissolution of a gallium arsenide wafer as set forth in claim 7 wherein controlling of the pattern of light is by applying a mask of porous aluminum oxide over the output end of said laser light source.

References Cited

UNITED STATES PATENTS

| | | | |
|---|---|---|---|
| 2,691,736 | 10/1954 | Haynes | 204—143 GE |
| 3,196,094 | 7/1965 | Davis | 204—143 GE |
| 3,265,599 | 8/1966 | Soonpaa | 204—143 GE |
| 3,637,380 | 1/1972 | Hallman et al. | 204—143 R |

TA-HSUNG TUNG, Primary Examiner